United States Patent [19]
Partlo et al.

[11] Patent Number: 6,151,346
[45] Date of Patent: Nov. 21, 2000

[54] HIGH PULSE RATE PULSE POWER SYSTEM WITH FAST RISE TIME AND LOW CURRENT

[75] Inventors: William N. Partlo, Poway; Daniel L. Birx, Oakley; Richard M. Ness, San Diego; Daniel A. Rothweil, Poway; Paul C. Melcher, El Cajon; Brett D. Smith, San Diego, all of Calif.

[73] Assignee: Cymer, Inc., San Diego, Calif.

[21] Appl. No.: 09/370,739

[22] Filed: Aug. 9, 1999

Related U.S. Application Data

[63] Continuation-in-part of application No. 08/990,848, Dec. 15, 1997, Pat. No. 5,940,421.

[51] Int. Cl.$^7$ ............................................. H01S 3/00
[52] U.S. Cl. ............................... 372/38; 372/57; 372/69
[58] Field of Search .................................. 372/38, 57, 69, 372/25

[56] References Cited

U.S. PATENT DOCUMENTS

| | | | |
|---|---|---|---|
| 3,849,670 | 11/1974 | Lourigan | 307/108 |
| 4,549,091 | 10/1985 | Fahlen et al. | 307/106 |
| 4,803,378 | 2/1989 | Richardson | 307/108 |
| 5,124,629 | 6/1992 | Ball et al. | 323/268 |
| 5,138,622 | 8/1992 | Friede et al. | 372/38 |
| 5,142,166 | 8/1992 | Birx | 307/419 |
| 5,177,754 | 1/1993 | Ball et al. | 372/38 |
| 5,309,462 | 5/1994 | Taylor et al. | 372/38 |
| 5,313,481 | 5/1994 | Cook et al. | 372/37 |
| 5,315,611 | 5/1994 | Ball et al. | 372/56 |
| 5,319,665 | 6/1994 | Birx | 372/69 |
| 5,359,279 | 10/1994 | Gidon et al. | 323/282 |
| 5,448,580 | 9/1995 | Birx et al. | 372/38 |
| 5,514,918 | 5/1996 | Inatomi et al. | 307/106 |
| 5,729,562 | 3/1998 | Birx et al. | 372/38 |
| 5,982,800 | 11/1999 | Ishihara et al. | 372/57 |

OTHER PUBLICATIONS

Melville, W.S., "The Use of Saturable Reactors As Discharge Devices For Pulse Generators", Radio Section, Paper No. 1034, Sep. 15, 1950, pp. 185–207.

Lassiter, Edward M., et al., "High–Power Pulse Generation Using Semiconductorsand Magnetic Cores", AIEE Summer General Meeting, Nov. 1960, pp. 511–517.

Birx, Daniel L., et al, "Basic Principles Governing the Design of Magnetic Switches", Lawrence Livermore Laboratory Publication UCID–18831, Nov. 18, 1980.

Merritt, B. T. and Dreifuerst, G. R., "Developmentand Operation of a Solid–State Switch For Thyratron Replacement", Lawrence Livermore National Laboratory Publication UCRL–JC–105355,Jun. 14, 1991.

Yanagise, H., et al., "Solid–State Power Device for Excimer Laser", Proceedings of the Joint Conference on Electronic Devices and Semiconductor Power Conversion, Sept. 13, 1995.

Yanase, H., et al., "Solid–State Pulse Power Module for Excimer Laser", Electronic Devices and Semiconductor Power Conversion Joint Research Society, Sep. 13, 1995.

*Primary Examiner*—Leon Scott, Jr.
*Attorney, Agent, or Firm*—John R. Ross, Esq.

[57] ABSTRACT

A high pulse rate pulse power source for supplying controlled high energy electrical pulses at rates of 2000 Hz or greater. The source includes a pulse generating circuit including a charging capacitor, a solid state switch and a current limiting inductor. Pulses generated in the pulse generating circuit are compressed in at least two pulse compression circuits and a step-up pulse transformer increases peak voltage to at least 12,000 volts. A very fast regulated power supply is provided for charging the charging capacitor in less than 400 microseconds and a pulse control system including a programmed processor controls the charging of the charging capacitor to an accuracy of less than about one percent at a rate of at least 2000 charges per second.

26 Claims, 13 Drawing Sheets

HIGH PULSE RATE PULSE POWER SYSTEM WITH FAST RISE TIME AND LOW CURRENT

The present invention is a continuation-in-part of Ser. No. 08/990,848, filed Dec. 15, 1997 now U.S. Pat. No. 5,940,421. This invention relates to pulse power systems and in particular to high pulse rate pulse power systems for electric discharge lasers.

BACKGROUND OF THE INVENTION

In typical gas discharge lasers a gain medium is created by an electric discharge between two elongated electrodes into a circulating gas. Very high voltages are usually required to initiate the discharge but once the discharge begins, a plasma is created which reduces the electrical resistance between the electrodes to almost zero, effectively creating what is almost a short circuit. This requires a method to limit the current once the discharge has started. A common method to deal with the two issues is to provide a "peaking" capacitor (Cp) in parallel with the electrodes. The peaking capacitor is periodically charged with the voltage needed to initiate the discharge but with only enough electrical energy for one pulse. The almost short circuit between the electrodes created by the high voltage drains the peaking capacitor of its energy which terminates the pulse. In high pulse rate electric discharge lasers (e.g., 1000 pulses per second) a gas circulating system produces a gas flow (such as 1,000 inches/second) between the electrodes which quickly replaces the ionized gas between the electrodes resulting from each pulse with fresh gas prior to the next pulse. The next pulse is generated by another quick charge on the peaking capacitor similar to the prior one. Thus, it is the job of the pulse power system to provide on the peaking capacitor sufficient voltage and electrical energy for one pulse at a desired pulse rate, such as 1,000 times per second.

In a prior art system, the peaking capacitor is charged from a 12–20 kv DC power source using a high voltage switch to charge a charging capacitor, Co, and a high voltage switch such as a thyratron to transfer the energy on the charging capacitor to the peaking capacitor. Other prior art pulse power systems use magnetic pulse compression circuits in order to provide the needed quick repetitive high voltage, high energy charging of the peaking capacitor. Examples are described in U.S. Pat. Nos. 5,448,580 and 5,313,481 which are incorporated herein by reference. These circuits normally utilize multi-stage LC networks which convert relatively long, relatively low voltage pulses into the needed very short high voltage pulses.

The prior art includes pulse power systems supplying very high voltage short pulses for industrial gas discharge lasers such as excimer lasers at pulse rates in the range of 1,000 Hz. These lasers need to operate reliably 24 hours per day for many weeks with only short down times for routine maintenance. There is a need for pulse power systems with increased reliability which can operate at pulse rates in the range of 2,000 Hz to 5,000 Hz or greater.

SUMMARY OF THE INVENTION

The present invention provides a high pulse rate pulse power source for supplying controlled high energy electrical pulses at rates of up to 4000 Hz or greater. The source includes a pulse generating circuit including a charging capacitor, a solid state switch and a current limiting inductor. Pulses generated in the pulse generating circuit are compressed in at least two pulse compression circuits and a step-up pulse transformer increases peak voltage to at least 12,000 volts. A very fast regulated power supply is provided for charging the charging capacitor in less than 200 microseconds and a pulse control system, including a programmed processor, controls the charging of the charging capacitor to an accuracy of less than about one percent at a rate of up to 4000 charges per second or greater.

A preferred embodiment of the present invention useful for providing electrical pulses for excimer lasers, provides pulses of up to 5.5 Joules per pulse at pulse rates up to 4000 Hz or greater. In this embodiment a peaking capacitor is charged with up to 5.5 Joules from zero voltage to a discharge voltage in the range of 16,000 volts in about 100 ns. This is substantially faster than prior art designs and provides significant improvements in lasing efficiency. This faster rise time is achieved using two stages of pulse compression and a 1:23 pulse transformer, with a four-sectioned straight stainless steel rod as a secondary "winding", in between the first and second stages. In this preferred embodiment pulse energy of each pulse is controlled with a feedback control system in which the energy of previous pulses are measured and the measurements are used to determine a control voltage for a charging capacitor. This charging capacitor is then charged to the control voltage using a regulated power supply. Extremely rapid precise charging is provided in which the charging capacitor is charged at the rate of about 3 volts per microsecond to a few volts in excess of the control voltage then bleed down through a bleed circuit to the control voltage.

DETAILED DESCRIPTION OF PREFERRED EMBODIMENTS

Preferred embodiments of the present invention can be described by reference to the drawings.

First Preferred Embodiment

Figure 1:
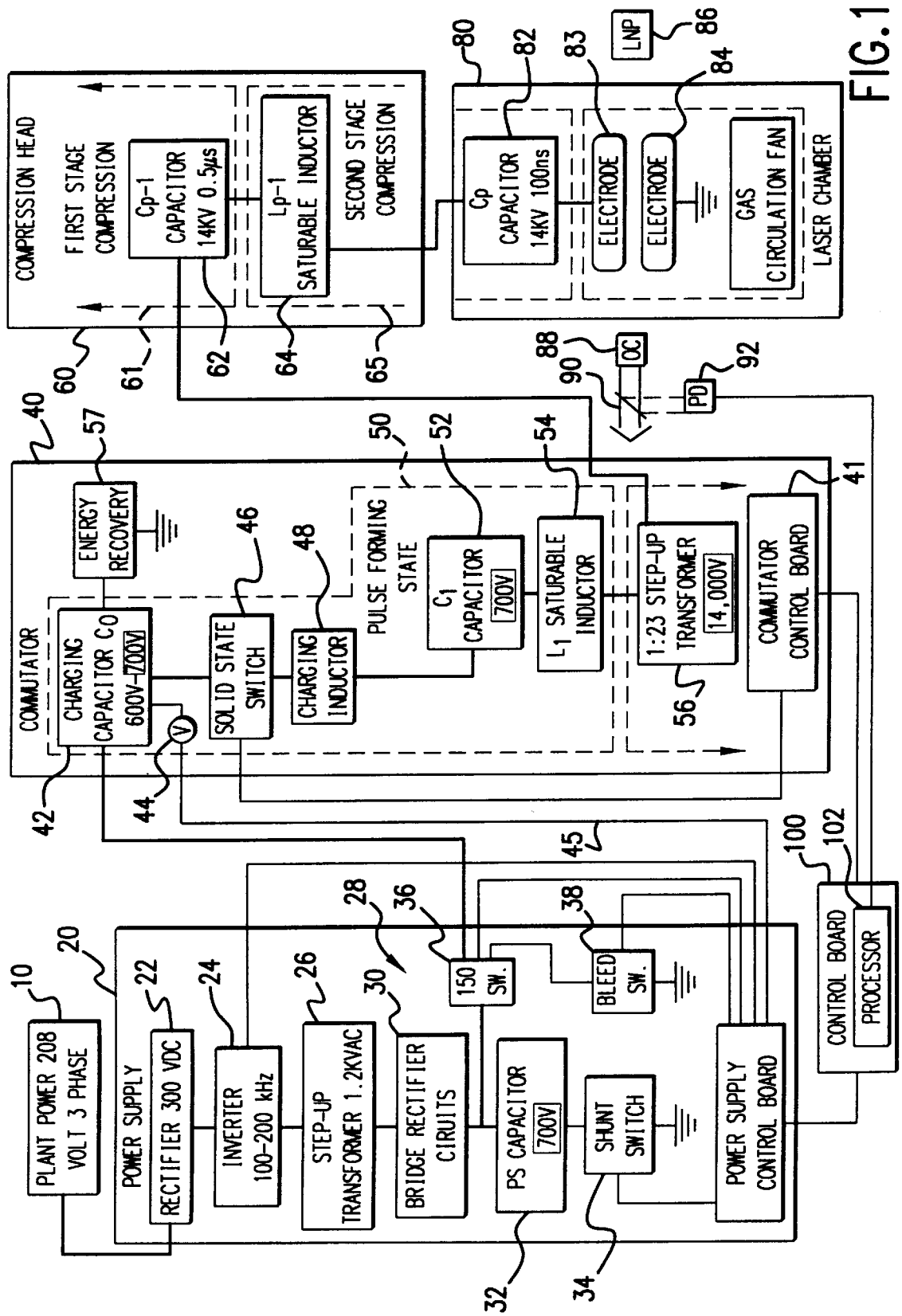
FIG. 1 is a block diagram of a preferred embodiment of the present invention.
Figure 2:
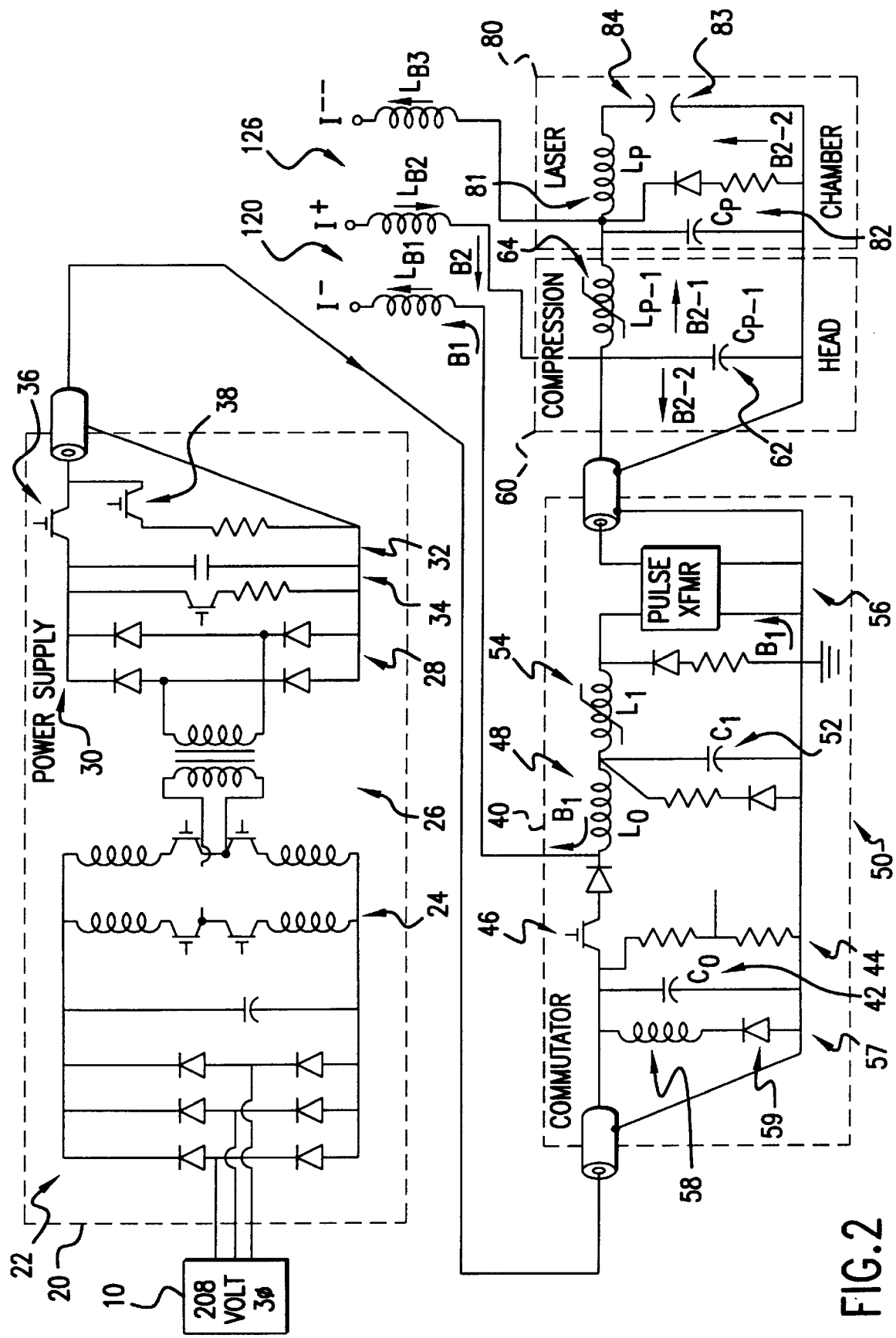
FIG. 2 is a simplified circuit diagram of the above preferred embodiment.

A first preferred embodiment of the present invention, which is the pulse power system for an industrial narrow-band KrF excimer laser, is shown in block diagram form in FIG. 1. A simplified combination block and circuit diagram of this preferred embodiment is shown in FIG. 2. The diagrams show a preferred embodiment built and tested by the Applicants for converting 208 volt three phase standard plant alternating current into 0.5 Joule to 6 Joule, 12 kv to 22 kv electrical pulses on a peaking capacitor of the excimer laser at pulse rates in the range of 2,000 Hz or greater. A system description is first provided below followed by a more detailed description of some of the important details of the individual modules and components of the system.

System Description

This preferred embodiment is manufactured in four separate modules as indicated in FIGS. 1 and 2, each of which becomes an important part of the excimer laser system and each of which can be quickly replaced in the event of a parts failure or in the course of a regular preventative maintenance program. These modules are designated by Applicants: high voltage power supply module 20, commutator module 40, compression head module 60 and laser chamber module 80.

High Voltage Power Supply Module

High voltage power supply module 20 comprises a 300 volt rectifier 22 for converting the 208 volt three phase plant power from source 10 to 300 volt DC. Inverter 24 converts the output of rectifier 22 to high frequency 300 volt pulses in the range 100 kHz to 200 kHz. The frequency and the on period of inverter 24 are controlled by the HV power supply control board 21 in order to provide course regulation of the ultimate output pulse energy of the system. The output of inverter 24 is stepped up to about 1200 volts in step-up transformer 26. The output of transformer 26 is converted to 1200 volts DC by rectifier 28 which includes a standard bridge rectifier circuit 30 and a filter capacitor 32. DC electrical energy from circuit 30 charges 8.1 $\mu$F Co charging capacitor 42 in commutator module 40 as directed by HV power supply control board 21 which controls the operation of inverter 24 as shown in FIG. 1. Set points within HV power supply control board 21 are set by laser system control board 100.

The reader should note that in this embodiment as shown in FIG. 1 that pulse energy control for the laser system is provided by power supply module 20. The electrical circuits in commutator 40 and compression head 60 merely serve to amplify and compress the electrical energy stored on charging capacitor 42 by power supply module 20. As an example of this control, FIG. 1 indicates that control board 100 has controlled the power supply to provide 700 volts to charging capacitor 42 which during the charging cycle is isolated from the down stream circuits by solid state switch 46.

Commutator Module

Commutator module 40 comprises Co charging capacitor 42, which in this embodiment is a bank of capacitors connected in parallel to provide a total capacitance of 8.1 $\mu$F. Voltage divider 44 provides a feedback voltage signal to the HV power supply control board 21 which is used by control board 21 to limit the charging of capacitor 42 to the voltage (called the "control voltage") which when formed into an electrical pulse and compressed and amplified in commutator 40 and compression head 60 will produce the desired discharge voltage on peaking capacitor 82 and across electrodes 83 and 84.

Figure 6A:
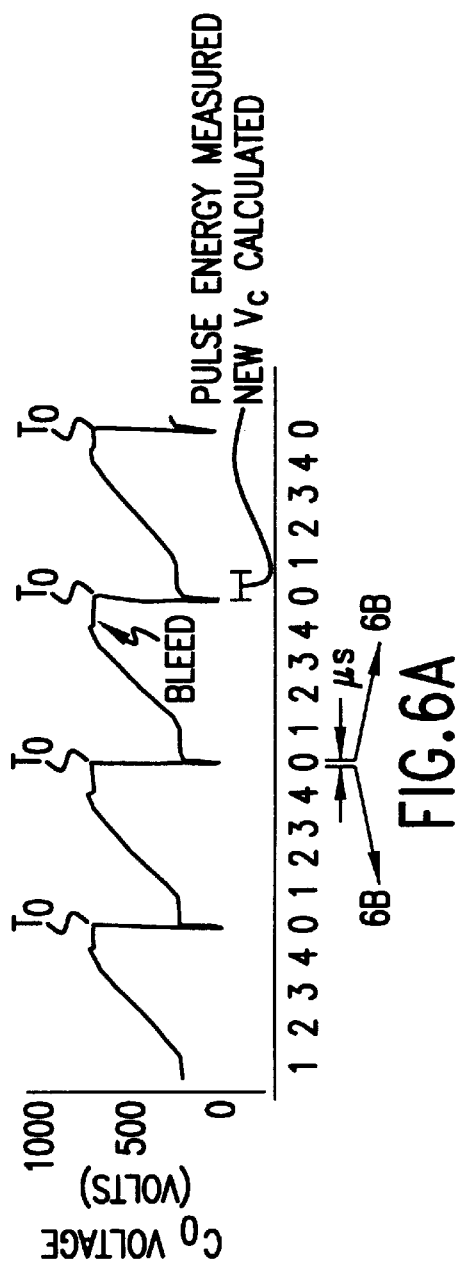
FIGS. 6A, 6B and 6C are time line charts showing pulse compression using the above preferred embodiment.

In this embodiment (designed to provide electrical pulses in the range of 3 Joules and 14,000 volts at a pulse rate of 2,000 pulses per second), about 250 microseconds (as indicated in FIG. 6A) are required for power supply 20 to charge the charging capacitor 42 to 700 volts. Therefore, charging capacitor 42 is fully charged and stable at the desired voltage when a signal from commutator control board 41 closes solid state switch 44 which initiates the very fast step of converting the 3 Joules of electrical energy stored on charging capacitor into a 14,000 volt discharge across electrodes 83 and 84. For this embodiment, solid state switch 46 is a IGBT switch, although other switch technologies such as SCRs, GTOs, MCTs, etc. could also be used. A 600 nH charging inductor 48 is in series with solid state switch 46 to temporarily limit the current through switch 46 while it closes to discharge the Co charging capacitor 42.

Pulse Generation Stage

Figure 6B:
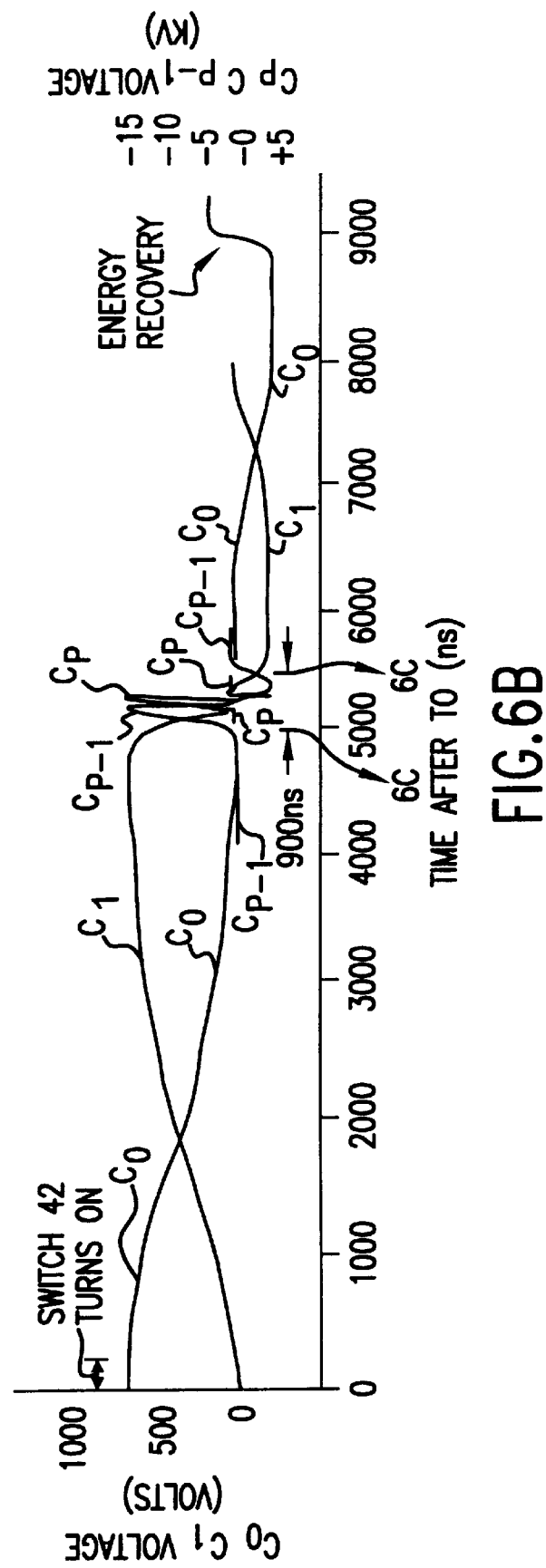

For the first stage of pulse generation 50, the charge on charging capacitor 42 is thus switched onto $C_1$ 8.5 $\mu$F capacitor 52 in about 5 $\mu$s as shown on FIG. 6B.

First Stage of Compression

Figure 6C:
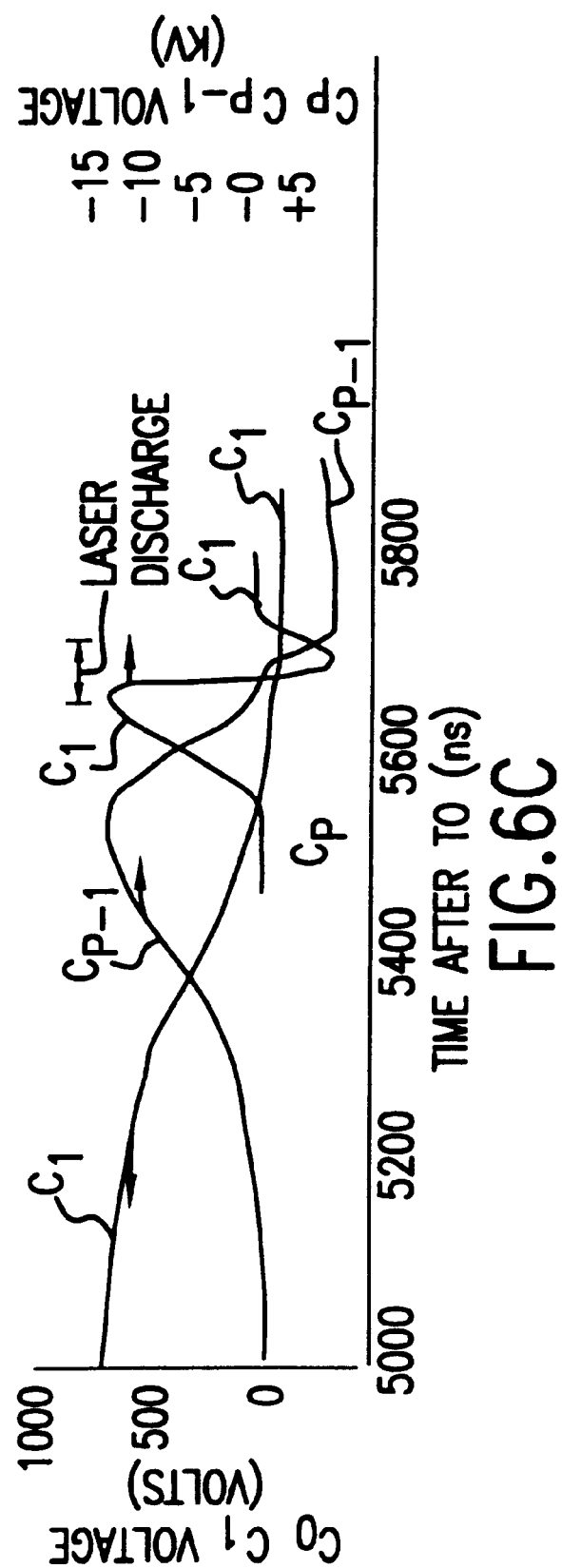

A saturable inductor 54 holds off the voltage on capacitor 52 and then becomes saturated allowing the transfer of charge from capacitor 52 through 1:23 step up pulse transformer 56 to $C_{p-1}$ capacitor 62 in a transfer time period of about 550 ns, as shown on FIG. 6C, for a first stage of compression 61.

The design of pulse transformer 56 is described below. Performance wise the transformer is an extremely efficient pulse transformer, transforming a 700 volt 17,500 ampere 550 ns pulse rate into a 16,100 volt, 760 ampere 550 ns pulse which is stored very temporarily on $C_{p-1}$ capacitor bank 62 in compression head module 60.

Compression Head Module

Compression head module 60 further compresses the pulse.

Second Stage of Compression

An $L_{p-1}$ saturable inductor 64 (with about 125 nH saturated inductance) holds off the voltage on 16.5 nF $C_{p-1}$ capacitor bank 62 for approximately 550 ns then allows the charge on $C_{p-1}$ to flow (in about 100 ns) onto 16.5 nF Cp peaking capacitor 82 located on the top of laser chamber 80 and which is electrically connected in parallel with electrodes 83 and 84. This transformation of a 550 ns long pulse into a 100 ns long pulse to charge Cp peaking capacitor 82 makes up the second stage and last of compression as indicated at 65 on FIG. 1.

Laser Chamber Module

About 100 ns after the charge begins flowing onto peaking capacitor 82 mounted on top of and as a part of the laser chamber module 80, the voltage on peaking capacitor 82 has reached about 14,000 volts and discharge between the electrodes begins. The discharge lasts about 50 ns during which time lasing occurs within the resonance chamber of the excimer laser. The resonance chamber is defined by a line narrowing package 86 comprised in this example by a 3-prism beam expander, a tuning mirror and an eschelle grating and an output coupler 88 which in this example, comprises a 10 percent R mirror. The laser pulse for this laser is a narrow band 20 ns 248 nm pulse of about 10 mJ and the repetition rate is 2000 pulses per second. The pulses define a laser beam 90 and the pulses of the beam are monitored by photodiode 92.

Control of Pulse Energy

The signal from photodiode 94 is transmitted to processor 102 in control board 100 and the processor uses this energy signal and preferably other historical pulse energy data to set the command voltage for the next and/or future pulses. In a preferred embodiment in which the laser operates in a series of short bursts (such as 100 pulse 0.5 second bursts at 2000 Hz separated by a dead time of about 0.1 second) processor 102 in control board 100 is programmed with a special algorithm which uses the most recent pulse energy signal along with the energy signal of all previous pulses in the burst along with other historical pulse profile data to select a control voltage for the subsequent pulse so as to minimized pulse-to-pulse energy variations and also to minimize burst-to-burst energy variations. This calculation is performed by processor 102 in control board 100 using this algorithm during a period of about 35 $\mu$s. The laser pulses occurs about 5 $\mu$s following the To firing of IGBT switch 46 shown on FIG. 6C and about 20 $\mu$s are required to collect the laser pulse energy data. (The start of the firing of switch 46 is called To.) Thus, a new control voltage value is thus ready (as shown on FIG. 6A) about 70 microseconds after the firing of IGBT switch 46 for the previous pulse (at 2,000 Hz the firing period is 500 $\mu$s). The features of this algorithm are described in greater detail in U.S. patent application Ser. No. 09/034,870 which is incorporated herein by reference.

Energy Recovery

This preferred embodiment is provided with electronic circuitry which recovers excess energy on charging capacitor 42 from the previous pulse which substantially reduces waste energy and virtually eliminates after ringing in the laser chamber 80.

This is accomplished by the energy recovery circuit 57, composed of energy recovery inductor 58 and energy recovery diode 59, the series combination of the two connected in parallel across Co charging capacitor 42. Because the impedance of the pulse power system is not exactly matched to that of the chamber and due to the fact that the chamber impedance varies several orders of magnitude during the pulse discharge, a negative going "reflection" is generated from the main pulse which propagates back towards the front end of the pulse generating system. After the excess energy has propagated back through the compression head 60 and the commutator 40, switch 46 opens up due to the removal of the trigger signal by the controller. The energy recovery circuit 57 reverses the polarity of the reflection which has generated a negative voltage on the charging capacitor 42 through resonant free wheeling (a half cycle of ringing of the L-C circuit made up of the charging capacitor 42 and the energy recovery inductor 58) as clamped against reversal of current in inductor 58 by diode 59. The net result is that substantially all of the reflected energy from the chamber 80 is recovered from each pulse and stored on charging capacitor 42 as a positive charge ready to be utilized for the next pulse. FIG. 6 is a time line chart showing the charges on capacitor Co, $C_1$, $C_{p-1}$ and Cp. The chart shows the process of energy recovery on Co.

Magnetic Switch Biasing

In order to completely utilize the full B-H curve swing of the magnetic materials used in the saturable inductors, a DC bias current is provided such that each inductor is reverse saturated at the time a pulse is initiated by the closing of switch 46.

In the case of the commutator saturable inductors 48 and 54, this is accomplished by providing a bias current flow of approximately 15 A backwards (compared to the normal pulse current flow) through the inductors. This bias current is provided by bias current source 120 through isolation inductor Lb1. Actual current flow travels from the power supply through the ground connection of the commutator, through the primary winding of the pulse transformer, through saturable inductor 54, through saturable inductor 48, and through isolation inductor Lb1 back to the bias current source 120 as indicated by arrows B1.

In the case of compression head saturable inductor, a bias current B2 of approximate 5 A is provided from the second bias current source 126 through isolation inductor Lb2. At the compression head, the current splits and the majority B2-1 goes through saturable inductor Lp-1 64 and back through isolation inductor Lb3 back to the second bias current source 126. A smaller fraction of the current B2-2 travels back through the HV cable connecting the compression head 60 and the commutator 40, through the pulse transformer secondary winding to ground, and through a biasing resistor back to the second bias current source 126. This second smaller current is used to bias the pulse transformer so that it is also reset for the pulsed operation. The amount of current which splits into each of the two legs is determined by the resistance in each path and is intentionally adjusted such that each path receives the correct amount of bias current.

Direction of Current Flow

In this embodiment, we refer to the flow of pulse energy through the system from the plant power source 10 to the electrodes and to ground beyond electrode 84 as "forward flow" and this direction as the forward direction. When we refer to an electrical component such as a saturable inductor as being forward conducting we mean that it is biased into saturation to conduct "pulse energy" in a direction toward the electrodes. When it is reverse conducting it is biased into saturation to conduct energy in a direction away from the electrodes toward the charging capacitor. The actual direction of current flow (or electron flow) through the system depends on where you are within the system. The direction of current flow is now explained to eliminate this as a possible source of confusion.

In this preferred embodiment Co is charged with (for example) a positive 700 volts such that when switch 46 is closed current flows from capacitor 42 through inductor 48 in a direction toward $C_1$ capacitor 52 (which means that electrons are actually flowing in the reverse direction). Similarly, the current flow is from $C_1$ capacitor 52 through the primary side of pulse transformer 56 toward ground. Thus, the direction of current and pulse energy is the same from charging capacitor 42 to pulse transformer 56. As explained below under the section entitled "Pulse Transformer" current flow in both the primary loops and the secondary loop of pulse transformer 56 are both toward ground. The result is that current flow between pulse transformer 56 and the electrodes during discharge is in the direction away from the electrodes toward transformer 56. Therefore, the direction of electron flow during discharge is from ground through the secondary of pulse transformer 56 temporarily onto $C_{p-1}$ capacitor 62 through inductor 64, temporarily onto Cp capacitor 82, through inductor 81, through electrode 84 (which is the discharge cathode) through the discharge plasma, through electrode 83 and back to ground. Thus, between pulse transformer 56, electrons flow in the same direction as the pulse energy during discharge.

Immediately following discharge currents and electron flow are reversed as explained above and special provisions have been made in this embodiment to deal with that reverse current flow as explained above in the section entitled Energy Recovery.

Detailed Power Supply Description

Figure 3:
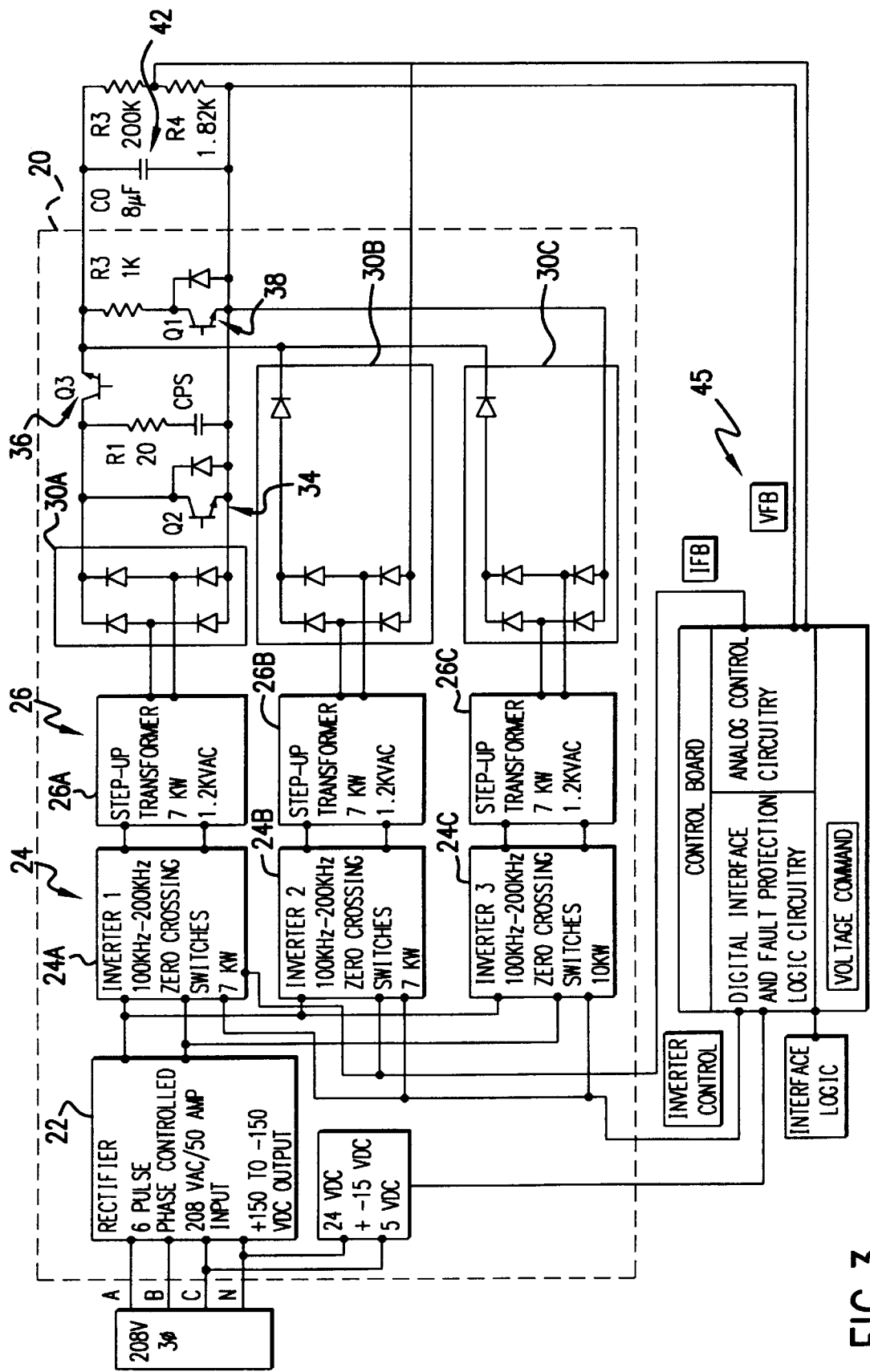
FIG. 3 is a combination block diagram, circuit diagram of a high voltage power supply which is part of the above preferred embodiment.

A more detailed circuit diagram of the power supply portion of the preferred embodiment is shown in FIG. 3. As indicated in FIG. 3, rectifier 22 is a 6 pulse phase controlled rectifier with a plus 150v to −150V DC output. Inverter 24 is actually three inverters 24A, 24B and 24C. Inverters 24B and 24C are turned off when the voltage on 8 $\mu$F Co charging capacitor 42 is 50 volts less than the command voltage and inverter 24A is turned off when the voltage on Co 42 slightly exceeds the command voltage. This procedure reduces the charge rate near the end of the charge. Step up transformers 26A, 26B and 26C are each rated at 7 kw and transform the voltage to 1200 volt AC.

Three bridge rectifier circuits 30A, 30B and 30C are shown. The HV power supply control board 21 converts a 12 bit digital command to an analog signal and compares it with a feedback signal 45 from Co voltage monitor 44. When the feedback voltage exceeds the command voltage, inverter 24A is turned off as discussed above, Q2 switch 34 closes to dissipate stored energy within the supply, Q3 isolation switch 36 opens to prevent any additional energy leaving the supply and Q1 bleed switch 38 closes to bleed down the voltage on Co 42 until the voltage on Co equals the command voltage. At that time Q1 opens.

Detailed Commutator and Compression Head Description

The principal components of commutator 40 and compression head 60 are shown on FIGS. 1 and 2 and are discussed above with regard to the operation of the system. In this section, we describe details of fabrication of the commutator.

Solid State Switch

Solid state switch 46 is an P/N CM 1000 HA-28H IGBT switch provided by Powerex, Inc. with offices in Youngwood, Pa.

Inductors

Figure 8A:
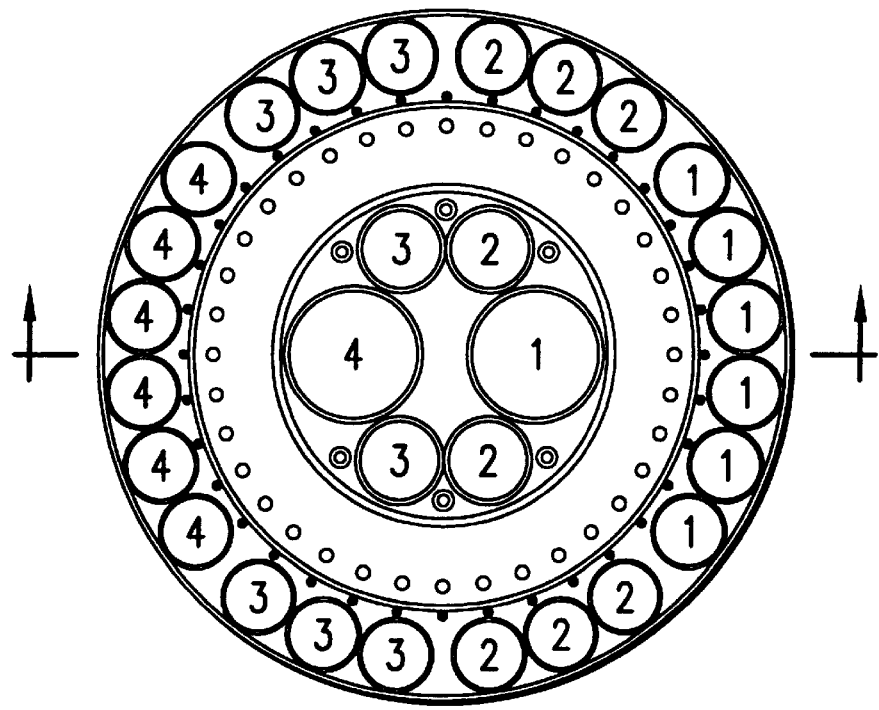
FIGS. 8A and 8B are drawing showing two views of a saturable inductor.
Figure 8B:
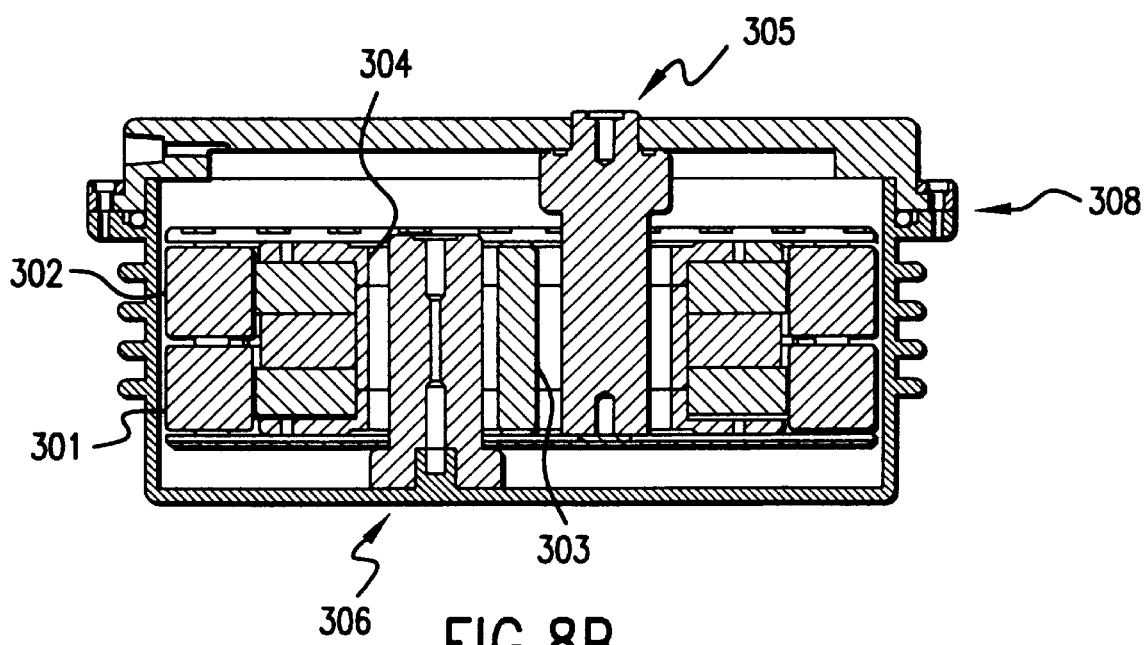

Inductors 48, 54 and 64 are saturable inductors similar to those described in U.S. Pat. Nos. 5,448,580 and 5,315,611. A top and section view of the saturable inductor 64 is shown respectively in FIGS. 8A and 8B. However, in the inductors of this embodiment, flux excluding metal pieces 301, 302, 303 and 304 are added as shown in FIG. 8B in order to reduce the leakage flux in the inductors. These flux excluding pieces greatly improve the pulse forming performance of the inductor in the system. The current makes four loops through vertical conductors. It enters at 305 travels down a large diameter conductor in the center labeled "1" and up six smaller conductors on the circumference also labeled "1". Other loops are similarly numbered and exits at 306. There is one additional equivalent turn formed by the flux exclusion metal itself and is the third turn in a five turn inductor. This has an advantage in that the voltage of the flux exclusion metal components is held at half the full voltage allowing a reduction in the safe hold-off spacing between the flux exclusion metal parts and the metal rods of the other turns.

Capacitors

Capacitor banks 42, 52 and 62 are all comprised of banks of off-the-shelf capacitors connected in parallel. These capacitors are available from suppliers such as Murata with offices in Smyrna, Ga. Applicants preferred method of connecting the capacitors and inductors is to bolt them to positive and negative terminals on special printed circuit board having heavy nickel coated copper leads in a manner similar to that described in U.S. Pat. No. 5,448,580.

Pulse Transformer

Figure 4:
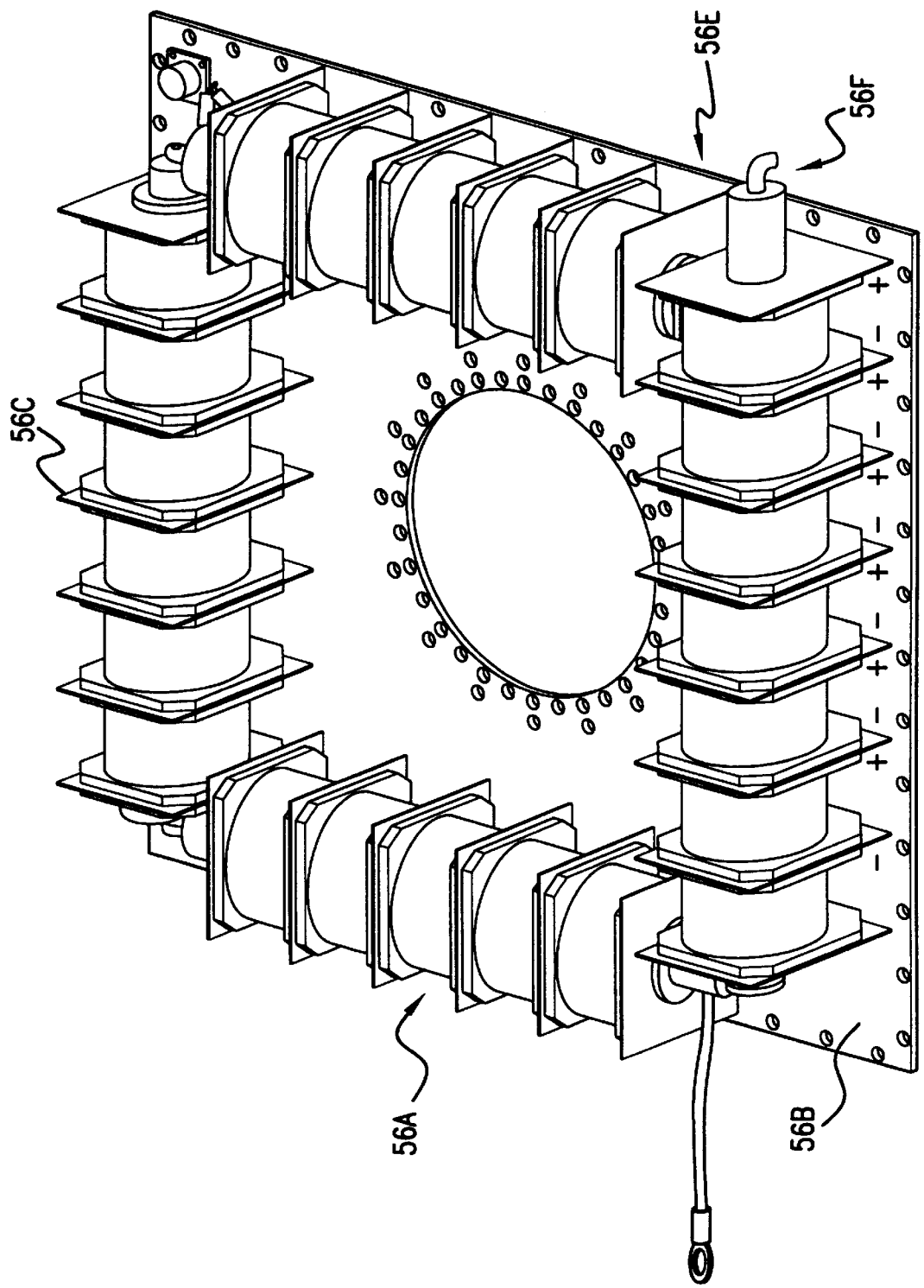
FIG. 4 is a prospective assembly drawing of a pulse transformer used in the above preferred embodiment.
Figure 5:
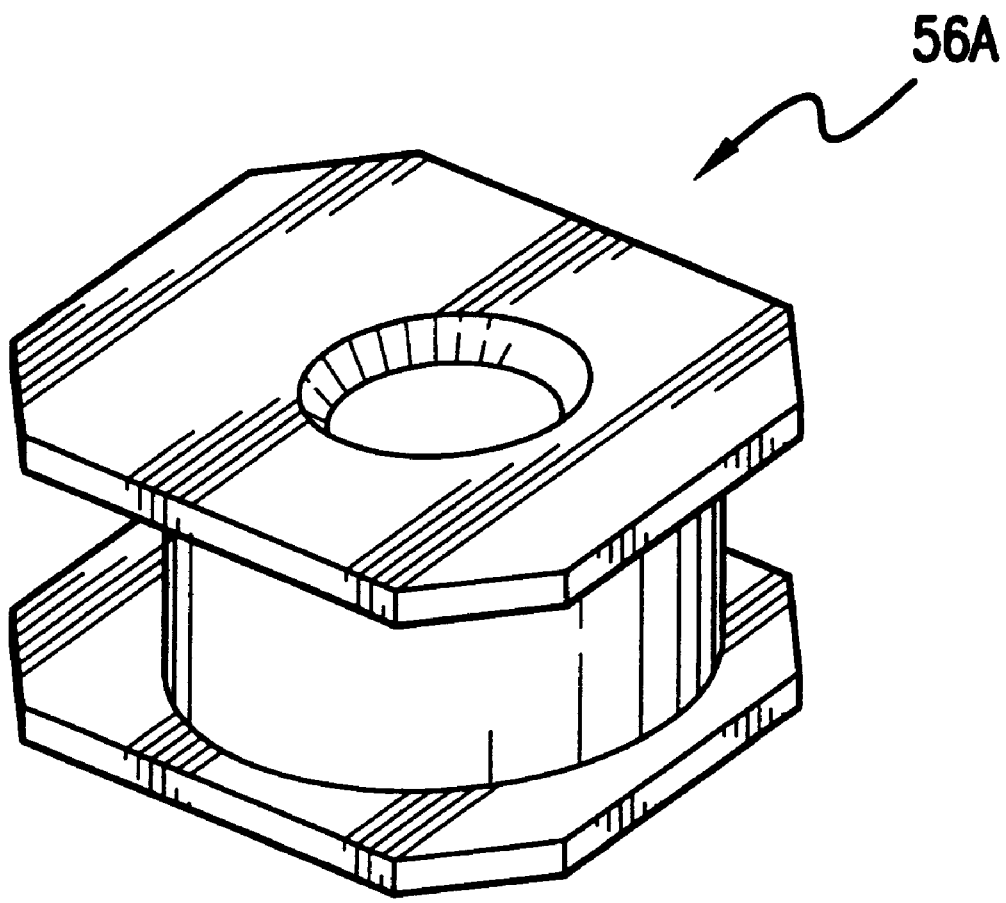
FIG. 5 is a drawing of a primary winding of a pulse transformer used in the above preferred embodiment.

Pulse transformer 56 is also similar to the pulse transformer described in U.S. Pat. Nos. 5,448,580 and 5,313,481; however, the pulse transformers of the present embodiment has only a single turn in the secondary winding and 23 induction units equivalent to 1/23 of a single primary turn. A drawing of pulse transformer 56 is shown in FIG. 4. Each of the 23 induction units comprise an aluminum spool 56A having two flanges (each with a flat edge with threaded bolt holes) which are bolted to positive and negative terminals on printed circuit board 56B as shown along the bottom edge of FIG. 4. Insulators 56C separates the positive terminal of each spool from the negative terminal of the adjacent spool. Between the flanges of the spool is a hollow cylinder 1 1/16 inches long with a 0.875 OD with a wall thickness of about 1/32 inch. The spool is wrapped with one inch wide, 0.7 mil thick Metglas™ 2605 S3A and a 0.1 mil thick mylar film until the OD of the insulated Metglas™ wrapping is 2.24 inches. A prospective view of a single wrapped spool forming one primary winding is shown in FIG. 5.

The secondary of the transformer is a single OD stainless steel rod mounted within a tight fitting insulating tube of electrical glass. The winding is in four sections as shown in FIG. 4. The stainless steel secondary shown as 56D in FIG. 4 is grounded to a ground lead on printed circuit board 56B at 56E and the high voltage terminal is shown at 56F. As indicated above, a 700 volt pulse between the + and − terminals of the induction units will produce a minus 16,100 volt pulse at terminal 56F on the secondary side. This design provides very low leakage inductance permitting extremely fast output risetime.

Details of Laser Chamber Electrical Components

The Cp capacitor 82 is comprised of a bank of 28 0.59 nf capacitors mounted on top of the chamber pressure vessel. (Typically a KrF laser is operated with a lasing gas made up of 1.0% krypton, 0.1% fluorine, and the remainder neon.) The electrodes are each solid brass bars about 28 inches long which are separated by about 0.5 to 1.0 inch. In this embodiment, the top electrode is the cathode and the bottom electrode is connected to ground as indicated in FIG. 1.

OTHER EMBODIMENTS

Reverse Polarization

In the system described above Co is charged with a positive voltage and the flow of electrons is into the ground electrode of the laser chamber. The circuit can be easily reversed with Co charged to a negative charging voltage of about 700 volts and the electron flow will be from the ground electrode to the high voltage electrodes. Also reverse flow of electrons across the electrode gap could be accomplished by changing the polarity of the secondary winding (i.e., the four-section stainless steel tube).

Bipolar Operation

Figure 7:
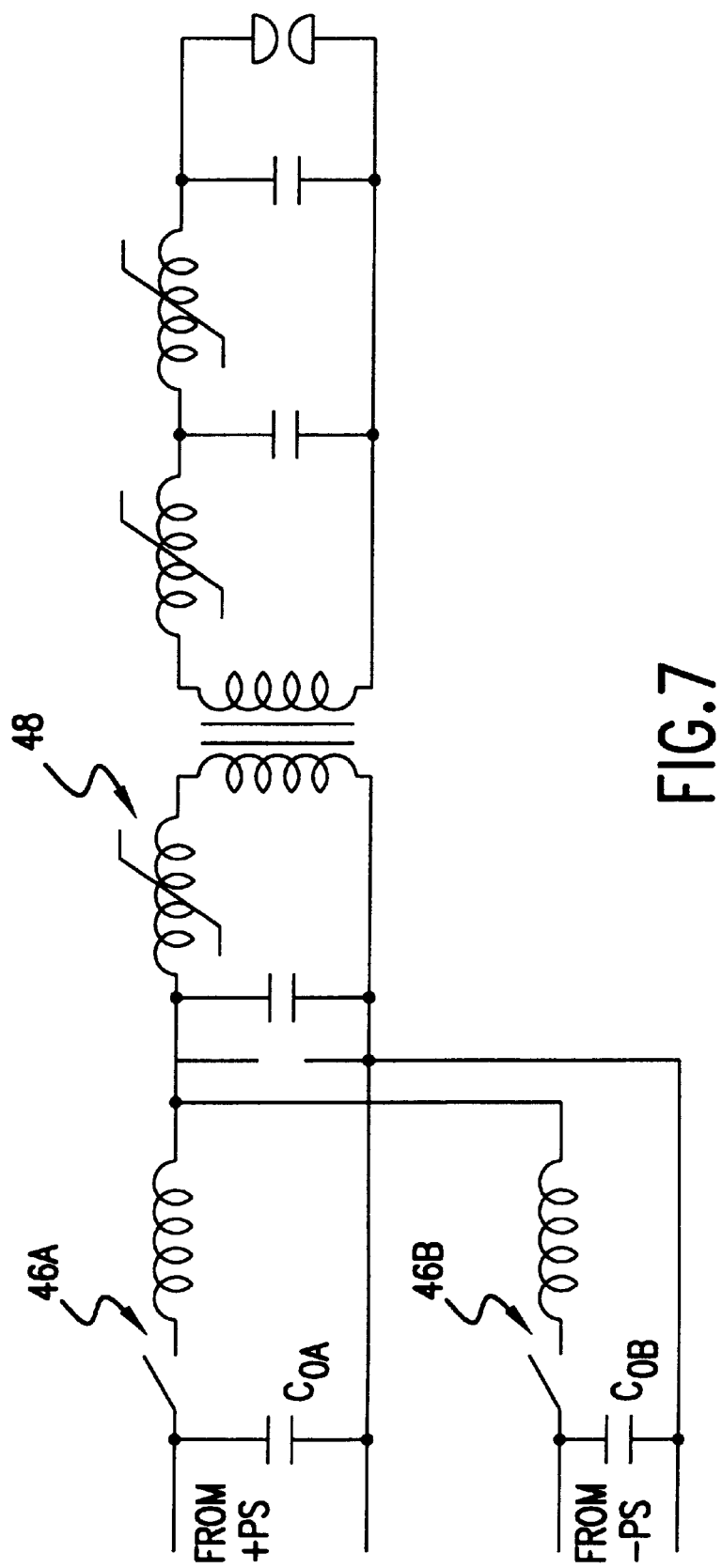
FIG. 7 is a simplified circuit diagram for providing bipolar pulses.

FIG. 7 shows a modification which would permit bi-polar operation of the laser. In this case, two power supplies are provided one supplying +1200 volts and the other providing −1200 volts. In addition, switch 46 is duplicated so that we have 46A and 46B. When 46A is closed the polarity of system is like that described in detail above. However, with 46A open and switch 46B closes the resulting pulse is everywhere reversed and the electron flow across the discharge gap is from the ground electrode to the high voltage electrode (in this case about +14,000 volts). In this case, the energy recovery circuit 57 is not needed. Instead (for example) Co$_A$ is charged to +700 v at To 46A will close allowing Co$_A$ to discharge through inductor 48 then it will open and 46B will close permitting the reflected energy to be recovered on Co$_B$ after recovery of the energy 46B opens. Then Co$_B$ is charged to −700 v and at the next To 46B closes allowing Co$_B$ to discharge through the circuit. The result is alternating discharge directions. This embodiment should provide for more even wear of the electrodes.

Compression Head Mounting

Figure 10A:
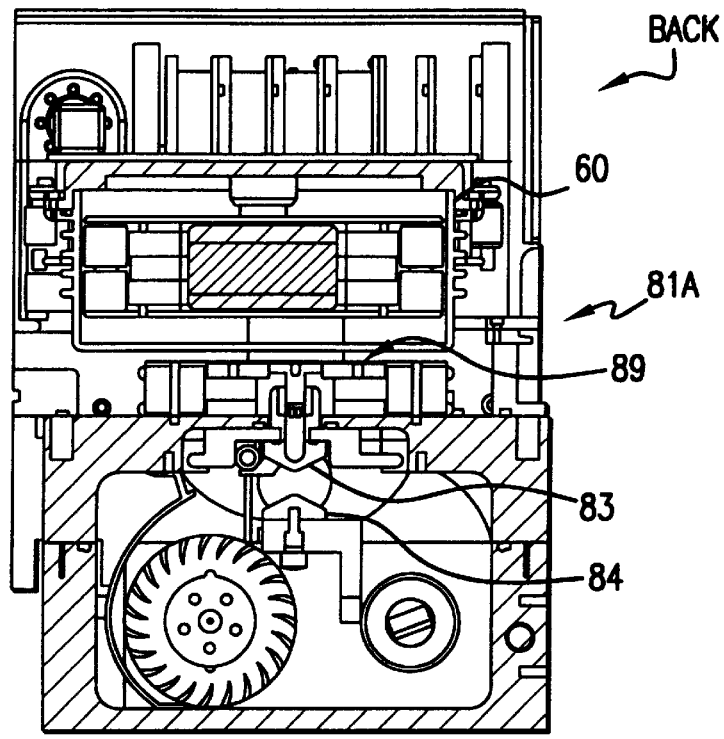
FIGS. 10A and 10B shows the mounting of a compression lead in a preferred embodiment.
Figure 10B:
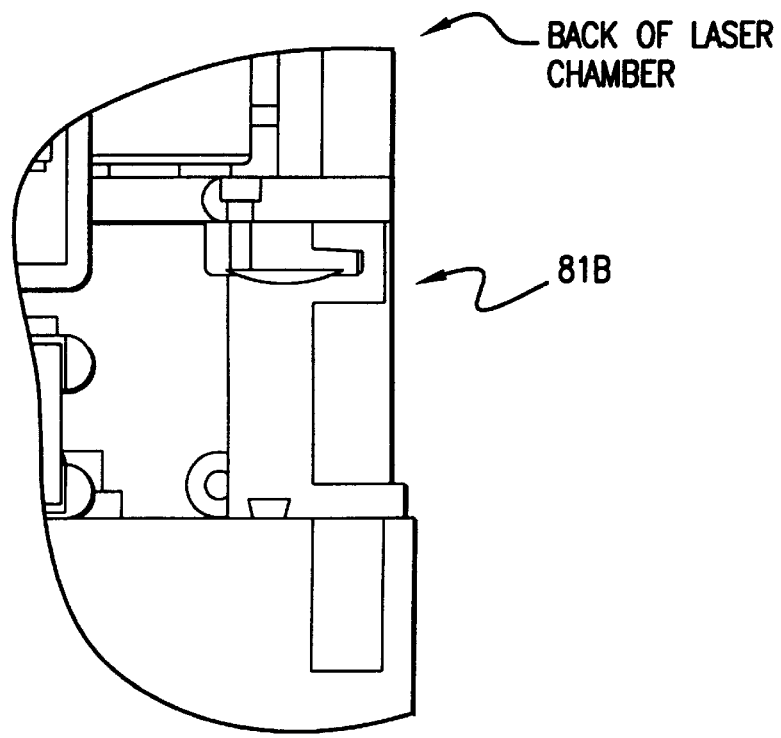

This preferred embodiment of the present invention includes a compression head mounting technique shown in FIGS. 10A and 10B. FIG. 10 is a side section view of the laser system showing the location of the compressor lead module in relation to electrodes 83 and 84. This technique was designed to minimize the impedance associated with the compression lead chamber connection and at the same time facilitates quick replacement of the compression head. As shown in FIGS. 10A and 10B the ground connection is made with an approximately 28 inch long slot tab connection along the back side of the compression head as shown at 81A in FIG. 10A and 81B in FIG. 10B. The top of the slot is fitted with flexible finger stock. A preferred finger stock material is sold under the tradename Multilam®.

The high voltage connection is made between a six-inch diameter smooth bottom of saturable inductor 64 and a mating array of flexible finger stock at 89 in FIG. 10A. As above, a preferred finger stock material is Multilam®. This arrangement permits the replacement of the compression head module for repair or preventative maintenance in about five minutes.

Pots and Pans Housing for Saturable Inductors

In prior art pulse power systems, oil leakage from electrical components has been a problem. In this preferred embodiment, oil insulated components are limited to the saturable inductors. Furthermore, the saturable inductors as shown in FIG. 8B are housed in a pot type oil containing housing in which all seal connections are located above the oil level to substantially eliminate the possibility of oil leakage. For example, the lowest seal in inductor 64 is shown at 308 in FIG. 8B.

Resonant Charging

In another preferred embodiment of the present invention, the power supply module described for the first preferred embodiment which utilizes two rectifiers, an inverter and a transformer as shown in FIGS. 1 and 2; is replaced by an off-the-shelf power supply and a resonance charging circuit. This latter approach provides much faster charging of the charging capacitor.

Figure 9:
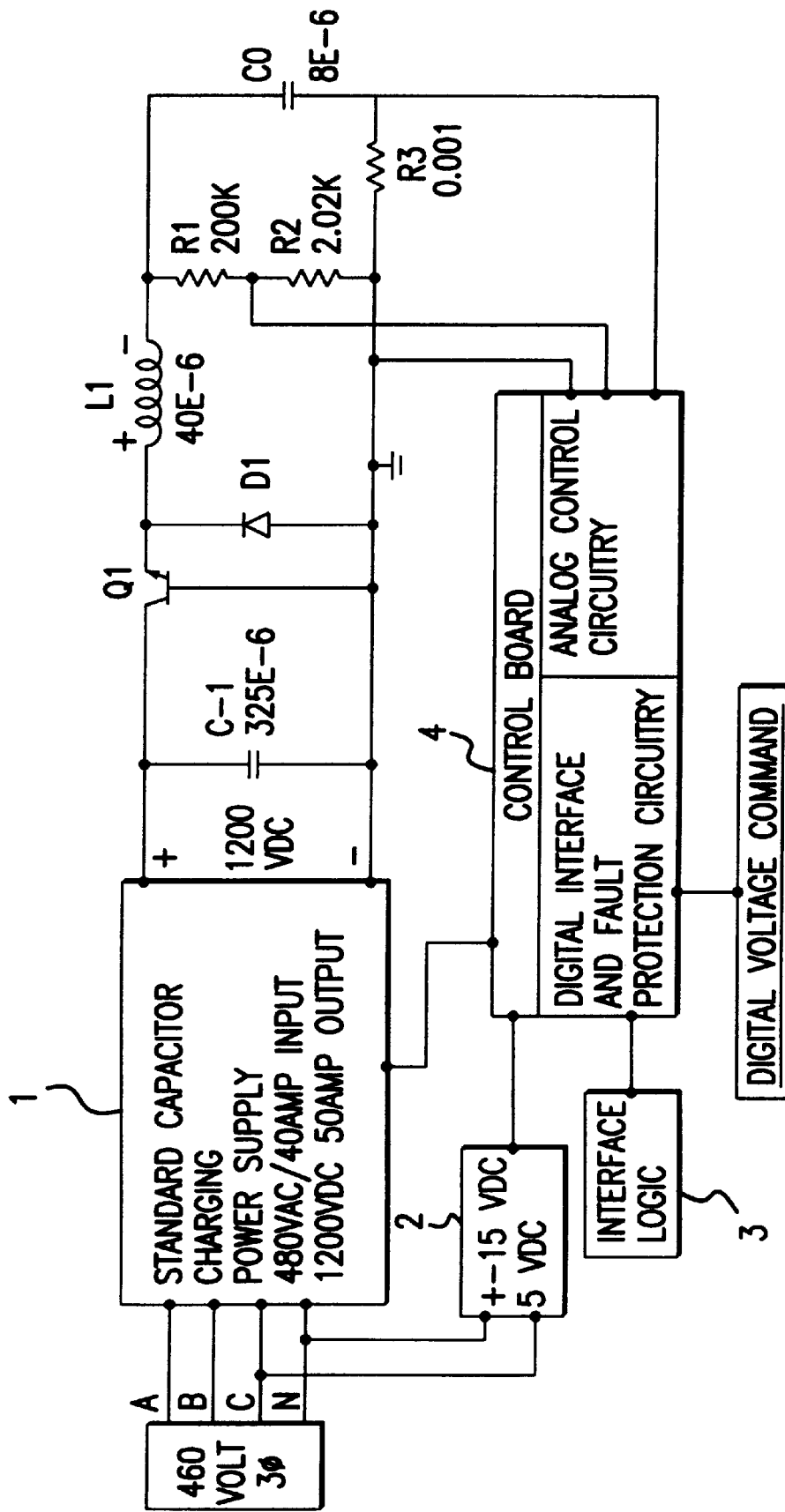
FIG. 9 is a circuit drawing showing a resonance power supply.

An electrical circuit showing this preferred embodiment is shown in FIG. 9. In this case, a standard capacitor charging power supply 200 having a 480 VAC/40 amp input and a 1200 VDC 50 amp output is used. Such power supplies are available from suppliers such as Ecgar, Maxwell, Kaiser and Ale. This power supply continuously changes a 325 μF capacitor 202 to the voltage level commanded 222 by the control board 204. The control board 202 also commands IGBT switch 206 closed and open to transfer energy from capacitor 202 to capacitor 42. Inductor 208 sets up the transfer time constant in conjunction with capacitor 202 and 42. Control board 202 receives a voltage feedback 212 that is proportional to the voltage on capacitor 42 and a voltage feedback 214 that is proportional to the current flowing through inductor 208. From these two feedback signals control board 204 can calculate in real time the final voltage on capacitor 42 should IGBT switch 206 open at that instant of time. Therefore with a command voltage 210 fed into control board 204 a precise calculation can be made of the stored energy within capacitor 42 and inductor 208 to compare to the required charge voltage commanded 210. From this calculation, the control board 204 will determine the exact time in the charge cycle to open IGBT switch 206.

After IGBT switch 206 opens the energy stored in the magnetic field of inductor 208 will transfer to capacitor 42 through the diode path 216. The accuracy of the real time energy calculation will determine the amount of fluctuation dither that will exist on the final voltage on capacitor 42. Due to the extreme charge rate of this system, too much dither will exist to meet the systems regulation requirements of ±0.05%. Therefore a bleed down circuit will be used.

Bleed down circuit 216 will be commanded closed by the control board 204 when current flowing through inductor 208 stops. The time constant of capacitor 42 and resistor 220 will be sufficiently fast to bleed down capacitor 42 to the command voltage 210 without being an appreciable amount of the total charge cycle.

Faster Risetime

From recent test data taken on a number of excimer lasers, it appears that faster risetime voltage pulses applied to the laser chamber can have significant advantages in several areas including overall laser efficiency, energy stability, etc. The advantages of faster risetimes appear to be even stronger for next generation (ArF and F$_2$) lasers than current KrF lasers.

One reason for this is associated with the chamber discharge characteristics. At typical pressures and mixes required to support application requirements of narrow bandwidth, etc., the chamber breakdown may occur rior to full transfer of energy from the last stage in the pulsed power module to the chamber peaking capacitance. In this case, a faster risetime output pulse allows more efficient energy transfer to the chamber peaking capacitance before the chamber discharge begins.

Traditionally, faster risetime pulses from a magnetic modulator simply require more stages of pulse compression time since the initial pulse is typically limited by the primary switching devices. The advantage of this specific approach is that additional pulse compression stages (with their added complications of reduced efficiency, increased cost, etc.) have not been required.

In this case, the faster output risetime has been provided by improvements in earlier compression stage hardware as well as a redesigned output stage.

In order to achieve the faster risetime output of the pulse power system, the output reactor of this specific example has been redesigned to use fewer turns in the toroidal shaped inductor. Additional core material has been included in the revised magnetic switch by including another 0.5" thick core. Since the saturated inductance goes as the square of the number of turns in the switch, reducing the number of turns from 5 to 2 has a significant impact in reducing the overall inductance (in spite of the fact that the height of the switch has increased). The disadvantage of this approach is that additional leakage voltage will be applied to the laser chamber during the time that voltage is building up on the magnetic switch, since the un-saturated inductance is also reduced due to the turns reduction. If this is undesirable, other approaches are available to reduce the effects of this leakage voltage.

Since the volt-second product of the switch is also proportional to the number of turns, additional material must be added to the switch to keep the same volt-second product required for the design. Unfortunately, core losses are also proportional to the volume of magnetic material. As a result, it is desirable to minimize the core material for efficiency as well as the initial cost of the material. As described above, one additional core has been added to the pre-existing 3 cores and each core has been re-designed to increase the cross-sectional area. However, these modifications still do not completely account for the reduction in volt-seconds due to the turns reduction. One solution to this issue is to improve the output risetime of previous stages such that a faster transfer time is provided. This, in turn, reduces the required volt-second product and reduces the core material requirements for the output stage switch.

The previous stage output risetime can be reduced by a combination of approaches. Approximately ½ of the inductance of the existing circuit is associated with the previous magnetic switch saturated inductance. As a result, the previous switch can also be re-designed to reduce this parameter. This can be done in a similar manner to the approach taken with the output stage switch (by reducing the number of turns). In this case, however, the existing design uses only 1 turn. As a result, the only alternative is to modify the saturated inductance by increasing the magnetic path length of the cores (since the saturated inductance is inversely proportional to this parameter). Other approaches to reducing the circuit inductance include reducing the cable connection length between the two SSPPM modules and reducing other various circuit stray inductances (e.g. increasing the number of individual capacitors associated with each energy storage stage since the stray inductance is the parallel inductance of each capacitor). The initial pulse generation stage can also be made faster as long as the "start" switch is capable of increased peak current levels and dI/dt levels.

Reduced Leakage Current

As stated above, a potential problem with magnetic pulse compression circuits is the leakage current from the output stage that occurs while the last compression stage is charging. This leakage current can lead to a rise in voltage across the laser electrodes prior to application of the main voltage pulse. If this pre-pulse voltage rise is too high, the discharge laser performance can be adversely affected.

One example of an adverse effect from the pre-pulse voltage rise is premature "light-off" of the corona tube used for pre-ionization of the laser gas. Corona tube pre-ionization uses a high electric field across an insulating surface to generate a corona in the laser gas near an insulating surface. This corona creates short wavelength UV radiation that in turn ionizes the laser gas within the volume between the laser electrodes. If the pre-pulse voltage rise caused by leakage current from the output stage of the magnetic compression circuit becomes too high, then the corona will be created too soon before the main voltage pulse and much of the ionization will be lost before the main discharge event.

The modifications described below provides a compact and efficient method for substantially eliminating the pre-pulse voltage rise caused by this leakage current. The modifications consists of an additional compression stage added to the previously described magnetic pulse compression circuit. This additional stage can be made to have no compression itself, but simply perform the function of preventing the leakage current from the previous stage from reaching the laser.

In the magnetic pulse compression circuit shown in FIG. 1, the laser's peaking capacitance and head inductance are represented by Cp and Lp. The capacitance and saturable inductance of the last stage of the compression circuit are represented by Cp-1 and Lp-1. The stages prior to the last stage are represented by C1 and L1.

It is the leakage through Lp-1 and Cp-1 is charging that causes a voltage rise on Cp and thus a voltage across the laser electrodes. A common method for mitigating this leakage current is to install one more stage between Cp-1 and Cp.

The disadvantages of using an additional stage for the sole purpose of blocking the leakage current are additional expense, size, and most importantly energy loss. This stage must be designed with the voltage hold-off able to handle the full energy of the main pulse as it is stored on the blocking capacitor. The volt-second product of the blocking saturable inductor must also be large enough to hold-off until full transfer from Cp-1 to the blocking capacitor occurs. Creating a design capable of handling these requirements is not impossible, but entails the use of a great many expensive components (i.e., high voltage capacitors, high speed saturable magnetic material, and high dielectric strength insulators).

The energy losses associated with this blocking stage can be considerable. Since this stage must operate at the charge time of the final output stage, typically 50–150 ns, losses due to dissipation in the high voltage capacitors and saturation losses in the magnetic material of the inductor can be as much as 10–20% of the total main pulse energy. It may be possible to increase the amount of energy sent into the compression circuit to compensate for this loss, but each stage must then be re-designed with extra saturable material to accommodate this additional stored energy.

The heat load placed on this blocking stage can also be problematic. Because the final stage must have fast risetime, stray inductance must be kept to a minimum. To achieve a low stray inductance, components must be kept close to each other. Such a design criteria is opposite to the requirements for many efficient heat transfer mechanisms. Use of cooling fluids such as dielectric oil can help in heat extraction, but the potential for spillage of this oil in a modem integrated circuit fabrication facility is unacceptable.

A typical pre-pulse voltage rise caused by leakage current is shown in FIG. 6C. (See the Cp voltage curve.) A blocking stage like the one described above must have sufficient volt* seconds to hold off both the leakage and the main 20 kV pulse. The area under the voltage curve for the leakage is much less than that for the main pulse, by a factor of up to 100X. If a circuit were implemented that held off for only a volt* second product equivalent to the area under the leakage, a considerable reduction in magnetic material would be realized.

Figure 11:
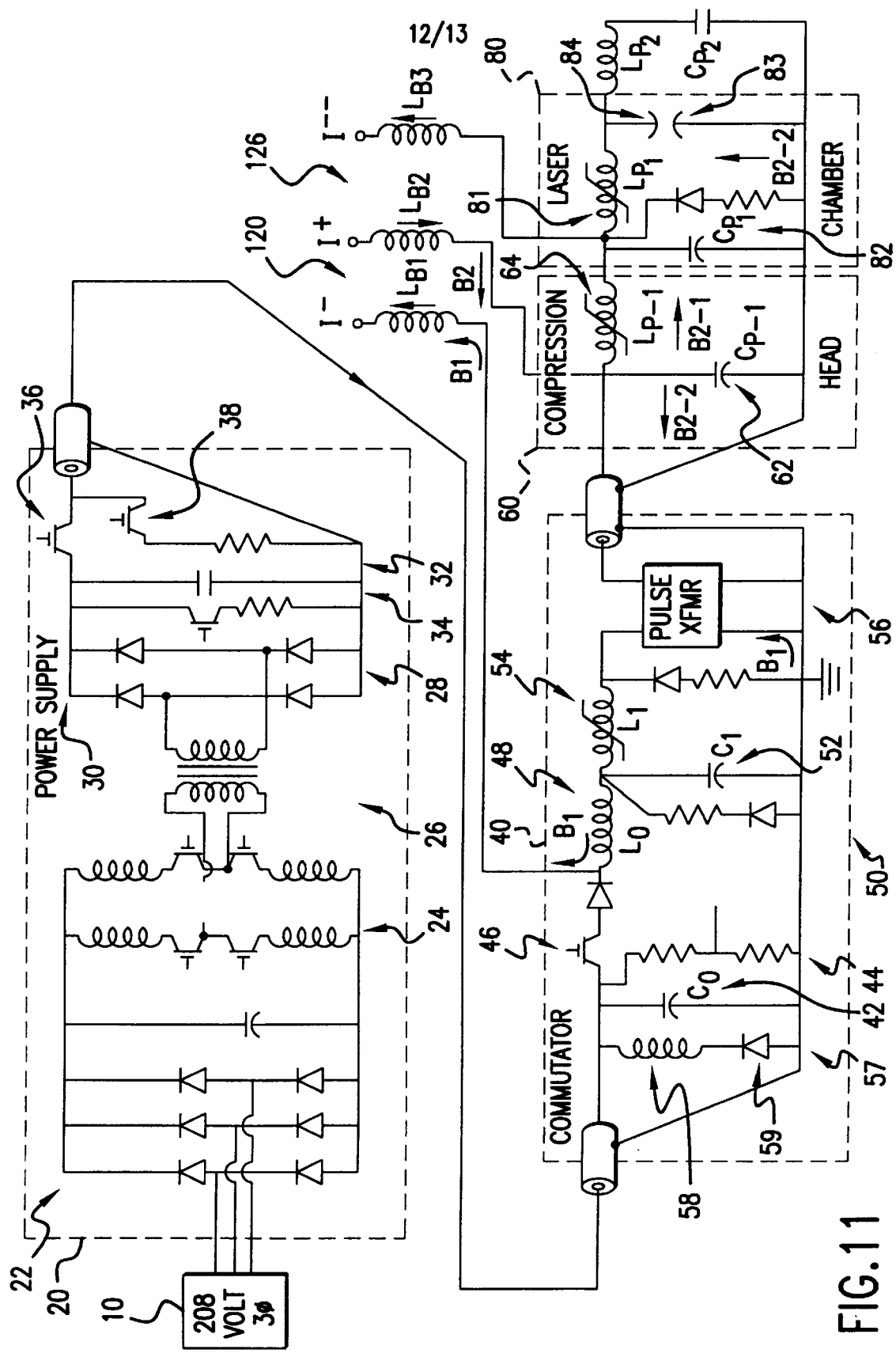
FIG. 11 is a modification of the FIG. 2 circuit diagram showing an embodiment with reduced leakage current.

Such a circuit is shown in FIG. 11 which is a modification of FIG. 2. The laser's peaking capacitance, Cp, is split into two groups called Cp and $Cp_2$ such that the sum of $Cp_1$ and $Cp_2$ equals Cp of the FIG. 2 circuit. The $Cp_2$ capacitance is attached to the chamber in the standard way and thus the inductance between $Cp_2$ and the laser electrodes, $Lp_2$, has the same value as the standard configuration, Lp. The second portion, $Cp_1$, is separated from the laser electrodes and $Cp_2$ by a saturable inductor, $Lp_1$. For reasons stated below, the saturated inductance of $Lp_1$ can be made similar in value to the standard head inductance Lp.

As leakage current passes through Lp-1 while Cp-1 is charging, this current will cause a voltage rise on $Cp_1$. Because of the saturable inductor, $Lp_1$, this voltage will not be placed across $Cp_2$ or the laser electrodes. The volt* second product of $Lp_1$ is chosen not to hold off the main pulse generated by the compression circuit, but instead it is sized only to hold off the voltage on $Cp_1$ caused by the leakage current from the compression circuit. Once Cp-1 is fully charged and Lp-1 saturates, $Lp_1$ also saturates so that there is a low inductance path between $Cp_1$ and $Cp_2$ consisting of the series combination of $Lp_1$ (saturated) and $Lp_2$. This series combination is typically ten times smaller than the saturated inductance of the last compression stage, Lp-1, so it has little or no effect on the transfer time from Cp-1 to the parallel combination of $Cp_1$ and $Cp_2$.

The reason that the saturated inductance of $Lp_1$ can be made essentially the same as Lp (and thus the same as $Lp_2$), is that the volt* second requirements are extremely small and the maximum voltage potential ever impressed across $Lp_1$ is less than 1 kV. Since the voltage hold-off across $Lp_1$ is less than 1 kV, a single sheet of 0.005" thick Kapton could be used as the insulator between the $Cp_1$ capacitor buss 102 and the $Cp_2$ capacitor buss. (The location of the thin sheet is indicated at 104 but it is too small to see on the drawing.) Such a small separation between each capacitor buss leads to a very small loop area and thus very low inductance.

The saturable inductor $Lp_1$, itself can be made to have very low saturated inductance since the amount of magnetic material required is so small (due to the low volt* second requirements).

Figure 12:
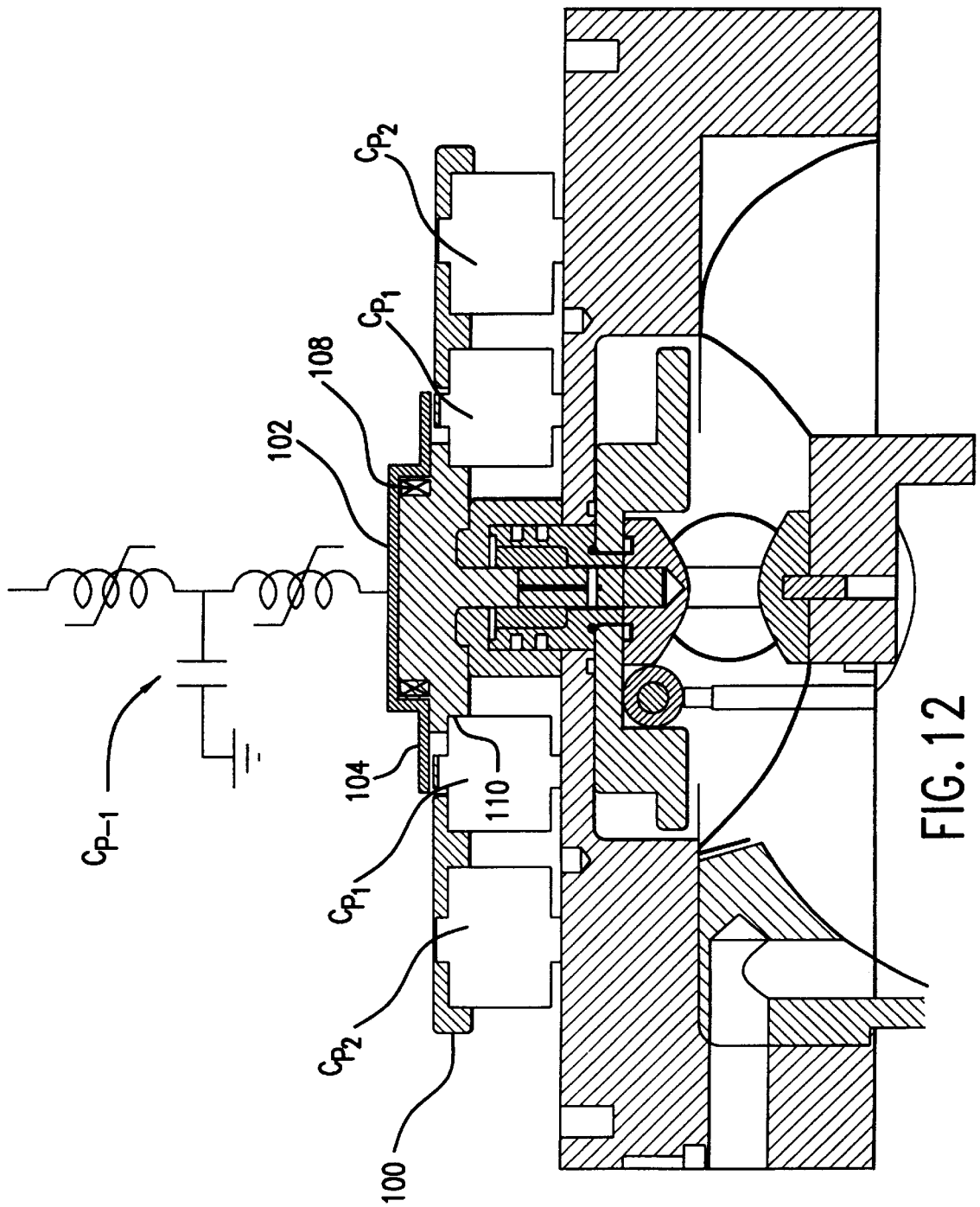
FIG. 12 is a cross-section drawing showing one example implementing the FIG. 11 circuit.

A detailed drawing of a preferred embodiment is shown in FIG. 5. The solid plate 100 shown in FIG. 12 is the buss for connecting the $Cp_2$ capacitors to the chamber's electrical feed-throughs. The much smaller plate 102 is the buss for connecting the $Cp_1$ capacitors to the compression head and to the top of the saturable inductor, $Lp_1$ which is created with conductor material 106 and coils 108 of tape comprised of a magnetic metal alloy, such as Metglass™ which is a commonly used material for constructing saturable inductors. This combination of conductor and magnetic material also serves to define L2 in the embodiment. In this case current downward from $Cp_1$ and sideways from $Cp_2$.

A choice must be made as to how to partition the Cp capacitance into $Cp_1$ and $Cp_2$. There are two considerations when making this design decision. The first is the size of $Cp_1$. If $Cp_1$ is made very small then the voltage rise on $Cp_1$ caused by the leakage current through Lp-1 will be large and the volt* second product of the $Lp_1$ saturable inductor will need to be large. This consideration tends to drive the $Cp_1$ value to a larger fraction of the total Cp capacitance.

The second consideration is the size of $Cp_2$. If $Cp_2$ is made small then the small spurious amounts of electrical energy that propagate between compression stages after the main pulse can lead to a large voltage spike on $Cp_2$. These spurious voltage spikes are commonly called late time blips and have been shown to cause electrode erosion if they have sufficient voltage to breakdown the laser gas. Increasing the size of $Cp_2$ would reduce the voltage levels caused by late time blips and thus mitigate the possibility of gas breakdown.

Unfortunately, these two considerations lead to opposing desires for the sizes of $Cp_1$ and $Cp_2$. It has been found that a range for $Cp_1$ between ⅓ and ⅔ of the total Cp can lead to satisfactory results. As long as the energy in late time blips can be minimized, $Cp_1$ should be made as large as possible to reduce the required volt* seconds for the $Lp_1$ saturable inductor. Reducing the volt* second requirements on $Lp_1$ make for lesser magnetic material requirements, smaller heat loading, and reduced saturated inductance.

Persons skilled in the art will recognize that many other embodiments of the present invention are possible based on the teachings expressed in the above disclosure.

Therefore, the reader should determine the scope of the present invention by the appended claims and their legal equivalents.

We claim:

1. A high pulse rate pulse power source providing pulse power to a pair of electrodes comprising:
   A) a pulse generating circuit, comprising:
      1) a charging capacitor for storing a charge at voltages in excess of 600 volts,
      2) a solid state switch, and
      3) a current limiting inductor;
      for generating electrical pulses with electrical energy in excess of 3 Joules and with peak voltages in excess of 600 volts;
   B) at least two pulse compression circuits, defining a first compression circuit providing a first pulse compression and a second compression circuit providing a second pulse compression, each compression circuit comprising a bank of capacitors and a saturable inductor, said second pulse compression circuit comprising a second saturable inductor having less than 6 turns;
   C) step-up pulse transformer for increasing the peak voltage of the electrical pulses to at least 12,000 volts said pulse transformer comprising a plurality of electrically parallel primary windings and a secondary winding comprises at least one substantially straight conductor;
   D) a very fast regulated power supply for charging said charging capacitor with at least 3 Joules of electrical energy at voltages of at least 600 volts, in less than 400 microseconds, and
   E) a very fast pulse control system comprising a processor for controlling the charging of said charging capacitor to an accuracy of less than one percent at a rate at least 2000 charges per second.

2. A pulse power source as in claim 1 wherein said saturable inductor in said second pulse compression circuit comprises less than three turns.

3. A pulse power source as in claim 1 wherein said second pulse compression circuit comprises a single bank of peaking capacitors.

4. A pulse power source as in claim 1 wherein said second pulse compression circuit comprises two separate banks of capacitors each bank is isolated from said electrodes by an inductance.

5. A pulse power source as in claim 4 wherein said inductance is provided by a single saturable inductor.

6. A pulse power source as in claim 1 wherein said step-up transformer is a part of said first compression circuit.

7. A pulse power source as in claim 1 wherein said at least one substantially straight conductor, four straight rods electrically connected in series.

8. A pulse power source as in claim 1 wherein said plurality of primary windings is at least 20 primary windings.

9. A pulse power source as in claim 1 wherein said regulated power supply comprises a bleed-down circuit comprising a switch and a resistor for bleeding down to voltage on said charging capacitor to a desired control voltage.

10. A pulse power source as in claim 1 wherein said source is a component of an electric discharge laser and furnishes electrical pulses to generate discharges between electrodes of said laser to generate laser pulses each pulse defining a pulse energy.

11. A pulse power source as in claim 10 and further comprising a pulse energy monitor for monitoring energy of said laser pulses.

12. A pulse power source as in claim 11 said processor for controlling the charging of said charging capacitor is programmed with an algorithm for calculating a control voltage for a pulse on the basis of pulse energy of at least one previous pulse.

13. A pulse power source as in claim 12 wherein said at least one previous pulse comprises all the pulses in a burst of pulses.

14. A pulse power source as in claim 13 wherein said at least one pulse also includes pulses in earlier bursts.

15. A pulse power source as in claim 1 wherein said at least two compression circuits is two compression circuits and the capacitor in said second compression circuit is a peaking capacitor.

16. A pulse power source as in claim 1 wherein said pulse generating circuit, said compression circuits, said pulse transformer and said power supply are fabricated into modules comprising components of an electric discharge laser system defining two electrodes.

17. A pulse power source as in claim 16 wherein said laser system is an excimer laser system.

18. A pulse power system as in claim 17 wherein said excimer laser system is a KrF laser system.

19. A pulse power system as in claim 18 wherein said modules are air cooled.

20. A pulse power system as in claim 19 wherein said saturable inductors are immersed transformer oil defining an oil level contained in a pot type container having at least one real function wherein said oil level is below all of said at least one seal junction.

21. A pulse power system as in claim 17 wherein said excimer laser system is an ArF laser system.

22. A pulse power system as in claim 16 wherein one of said two electrodes is connected to a ground and said pulse power system provides a negative high voltage to the other of said two electrodes.

23. A pulse power system as in claim 16 wherein one of said two electrodes is connected to a ground and said pulse power system provides a positive high voltage to the other of said two electrodes.

24. A pulse power system as in claim 16 wherein said pulse generating circuit is a first pulse generating circuit for generating negative pulses and further comprising a second pulse generating circuit for generating positive pulses, wherein said first pulse generating circuit and said second pulse generating circuit are controlled to produce alternating pulses to produce bipolar operation of the electric discharge laser.

25. A pulse power system as in claim 1 wherein at least one of said saturable inductors comprise at least one flux excluding piece.

26. A pulse power system as in claim 1 wherein said capacitor and inductors are connected electrically using copper clad printed circuit boards and bolts for connecting the capacitors and inductors to the printed circuit boards.

\* \* \* \* \*

UNITED STATES PATENT AND TRADEMARK OFFICE
CERTIFICATE OF CORRECTION

PATENT NO. : 6,151,346
DATED : November 21, 2000
INVENTOR(S) : William N. Partlo, et al.

It is certified that error appears in the above-identified patent and that said Letters Patent is hereby corrected as shown below:

Title page,
Item [54], change the title to read -- HIGH PULSE RATE PULSE POWER SYSTEM WITH FAST RISE TIME AND LOW LEAKAGE CURRENT --.

Signed and Sealed this

Thirtieth Day of October, 2001

*Attest:*

*Nicholas P. Godici*

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO. : 6,151,346
DATED : November 21, 2000
INVENTOR(S) : William N. Partlo et al.

It is certified that error appears in the above-identified patent and that said Letters Patent is hereby corrected as shown below:

Column 14,
Line 63, add the word -- comprises -- after the word "conductor", and before the word "four".

Column 15,
Line 12, add the word -- the -- after the word "monitoring" and before the word "energy".
Line 14, add the word -- wherein -- after the word "claim 11" and before the word "said".

Column 16,
Line 7, delete the words "real function" and add the words -- seal junction --.

Signed and Sealed this

Twelfth Day of October, 2004

JON W. DUDAS
*Director of the United States Patent and Trademark Office*